(12) United States Patent
Bhat et al.

(10) Patent No.: US 7,983,365 B2
(45) Date of Patent: Jul. 19, 2011

(54) AUTOMATICALLY SETTING AN OPERATIVE STATE OF A WIDEBAND AMPLIFIER

(75) Inventors: Janardhana Bhat, Singapore (SG); Maarten Heuvelman, Bruges (BE)

(73) Assignee: Koninklijke Philips Electronics N.V., Eindhoven (NL)

( * ) Notice: Subject to any disclaimer, the term of this patent is extended or adjusted under 35 U.S.C. 154(b) by 836 days.

(21) Appl. No.: 10/530,307

(22) PCT Filed: Oct. 1, 2003

(86) PCT No.: PCT/IB03/04328
§ 371 (c)(1),
(2), (4) Date: Apr. 4, 2005

(87) PCT Pub. No.: WO2004/032490
PCT Pub. Date: Apr. 15, 2004

(65) Prior Publication Data
US 2007/0147553 A1 Jun. 28, 2007

(30) Foreign Application Priority Data
Oct. 7, 2002 (WO) .................. PCT/SG02/00242

(51) Int. Cl.
*H04L 27/08* (2006.01)

(52) U.S. Cl. ......... 375/345; 375/148; 375/316; 375/346

(58) Field of Classification Search .......... 375/148, 375/316, 345, 346
See application file for complete search history.

(56) References Cited

U.S. PATENT DOCUMENTS

| 4,654,884 | A | * | 3/1987 | Sakai et al. ............. 455/183.2 |
|---|---|---|---|---|
| 5,010,405 | A | * | 4/1991 | Schreiber et al. ......... 348/432.1 |
| 5,513,387 | A | * | 4/1996 | Saito et al. ............... 455/243.1 |
| 5,722,061 | A | * | 2/1998 | Hutchison et al. ........ 455/245.1 |
| 5,758,271 | A | * | 5/1998 | Rich et al. ................ 455/234.1 |
| 5,877,822 | A | * | 3/1999 | Tazine et al. ................ 348/731 |
| 6,009,129 | A | * | 12/1999 | Kenney et al. .............. 375/346 |
| 6,073,848 | A | * | 6/2000 | Giebel ...................... 235/462.26 |
| 6,134,430 | A | * | 10/2000 | Younis et al. ............... 455/340 |
| 6,141,561 | A | * | 10/2000 | Izumiyama ............... 455/553.1 |
| 6,311,048 | B1 | * | 10/2001 | Loke ........................ 455/245.1 |
| 6,496,017 | B2 | * | 12/2002 | Bhat ............................ 324/616 |
| 6,687,489 | B1 | * | 2/2004 | Lapid ....................... 455/226.1 |
| 6,728,524 | B2 | * | 4/2004 | Yamanaka et al. ........ 455/232.1 |
| 6,831,705 | B2 | * | 12/2004 | Yamamoto ................... 348/731 |
| 7,061,993 | B2 | * | 6/2006 | Wieck .......................... 375/316 |
| 7,274,918 | B1 | * | 9/2007 | Albicker ................... 455/184.1 |
| 2001/0029172 | A1 | * | 10/2001 | Lee et al. ................. 455/234.1 |
| 2004/0053585 | A1 | * | 3/2004 | Kasperkovitz ............... 455/130 |

FOREIGN PATENT DOCUMENTS
EP 0 378 875 B1 7/1990
* cited by examiner

*Primary Examiner* — Chieh M Fan
*Assistant Examiner* — Siu M Lee (57) ABSTRACT

A multi-channel receiver (200) comprises: an input (111) for receiving a wideband signal potentially comprising multiple channels, a tuner stage (110), a wideband amplifier (201) connected between the input (111) and the tuner (110), a controllable switch (202) bridging the amplifier (201) and a switch controller (203) designed to generate a switch control signal (BSC). For controlling the switch, the switch controller (203) is designed to measure at least one signal quality parameter and to generate its switch control signal (BSC) on the basis of the measured parameter. The decision of switching the switch (202) to its open state (amplifier active) is exclusively taken during at least one time interval when the receiver is switched to a channel.

9 Claims, 4 Drawing Sheets

AUTOMATICALLY SETTING AN OPERATIVE STATE OF A WIDEBAND AMPLIFIER

The present invention relates to a method for automatically setting an operative state of a wideband amplifier in a multi-channel receiver the method comprising the steps of measuring at least one signal quality parameter and deciding to switch the amplifier either to its ON state (active state) or to its OFF state (inactive state) on the basis of the measured parameter. The invention further relates to a signal quality measuring system for use in a receiver capable of receiving at least one input signal. The invention also relates to a multi-channel receiver comprising:
an input for receiving a wideband signal potentially comprising multiple channels;
a tuner stage,
a wideband amplifier connected between said input and said tuner,
a controllable switch bridging said amplifier, and
a switch controller designed to generate a switch control signal.

As is commonly known, television signals are transmitted in transmission channels, each channel being characterized by at least one carrier frequency and a channel bandwidth. Typically, multiple television programs are broadcast simultaneously, in different transmission channels. A television receiver comprises at least one tuner for tuning the receiver to one selected channel and thus receiving the television signal of the selected television program for further processing. In a television set, such further processing may involve the reproduction of video and audio; in a recorder, such further processing may involve the recording of the television signal for future playback.

In practice, the reception conditions of television signals may vary. For instance, due to changing atmospheric conditions, the signal quality may vary with time. Also, in a certain reception location, among the set of television channels available, some signals may be relatively strong with relatively little noise whilst other signals may be relatively weak with relatively much noise, especially in the case of transmission by air, depending on, inter alia, the respective distances from the respective transmitters and the respective powers of these transmitters; in such a case, the signal quality may vary when switching from one program to another. Also, the receiver may be connected to a cable network with relatively constant signal quality, but, depending on, inter alia, the quality of this cable network and the distance from the closest amplifier, the signal may be strong or relatively weak. In the case of a cable network, it is also possible that the received RF signal is strong but the video content is noisy, depending on the video source used by the cable TV operators.

A television receiver should be able to handle all of these reception conditions and to function properly. To this end, it is known to equip a tuner with a low-noise wideband amplifier, hereinafter also referred to as LNA. In the case of a relatively weak RF signal, the LNA is switched ON in order to improve the signal-to-noise ratio (S/N) of demodulated video. However, such an LNA is a wideband amplifier operating on all television channels in the band, without input selectivity, and as a consequence unwanted inband intermodulation products from neighboring channels may be generated, especially if strong signals are received. In order to prevent this, such an LNA is implemented as a switchable amplifier, which is switched OFF if strong signals are received.

Although it is possible to provide for manual switching, automatic switching is preferred with a view to convenience for the user. In such a case, the receiver is also provided with an LNA control system for automatically switching the LNA ON or OFF, depending on the signal quality. This LNA control system comprises an LNA controller and a signal quality measuring system, which provides a signal quality indication signal for the LNA controller.

A main objective of the present invention is to improve such a control system. The invention is defined by the independent claims. The dependent claims define advantageous embodiments.

The object is realized in that the step of deciding to switch the amplifier to its ON state (active state) is exclusively taken during at least one time interval when the receiver is switched to a channel. The time interval when the receiver is switched to a channel is, for example, the time interval when the receiver is switched on, the time interval when a new channel is selected or a time interval during an installation process, whereby all channels are scanned.

On the basis of the measured parameters, the operating state of the wideband amplifier is set to either the ON state or the OFF state. As long as the receiver remains switched to the channel, the OFF state is always maintained, while during the ON state the wideband amplifier may be switched to the OFF state if the signal quality deteriorates. Once switched to the OFF state, the wideband amplifier remains in this state until a channel switching takes place. Annoying switching ON and OFF of the wideband amplifier, as may occur with existing receivers, is thus avoided.

In existing equipment, a signal quality measuring system basically measures only the signal strength of the signal (channel) to which the receiver is actually tuned. The decision whether to switch the LNA ON or OFF is then only based on the signal strength of the wanted signal itself. In one embodiment of the present invention, a signal quality measuring system is designed to measure the actual disturbing signal contributions from unwanted channels.

In existing equipment, a signal quality measuring system provides a quality signal, and the controller makes a decision by comparing the quality signal with a predetermined decision criterion. In one embodiment of the present invention, the controller is designed to measure whether or not the LNA actually offers an improvement. More particularly, the actual disturbing signal contributions are measured twice, once with the LNA switched ON and once with the LNA switched OFF. If the measurement with the LNA switched ON shows an improvement (or at least no degradation) as compared to the measurement with the LNA switched OFF, it is decided to keep the LNA switched ON. In contrast, if the signal quality with LNA ON is good but the signal quality with LNA OFF is better, it is decided to keep the LNA switched OFF.

In another embodiment of the present invention, a signal quality measuring system is designed to measure the signal conditions of all channels available for reception. This measurement is preferably performed as part of an installation procedure of the receiver, when the channel data are stored in a memory (auto tuning), because the entire frequency range of interest is swept during such an installation procedure. Even if only one channel is affected by bad signal quality, for example, due to intermodulation products, the LNA controller switches OFF the LNA, otherwise the LNA controller switches the LNA ON, and the LNA is maintained in the switched-off or switched-on condition, respectively, for the remainder of the operating life of the receiver apparatus, or until a new installation procedure is executed.

These and other aspects, features and advantages of the present invention will be further explained by means of the following description of the present invention with reference to the drawings, in which identical reference numerals indicate the same or similar parts, and in which.

Figure 1:
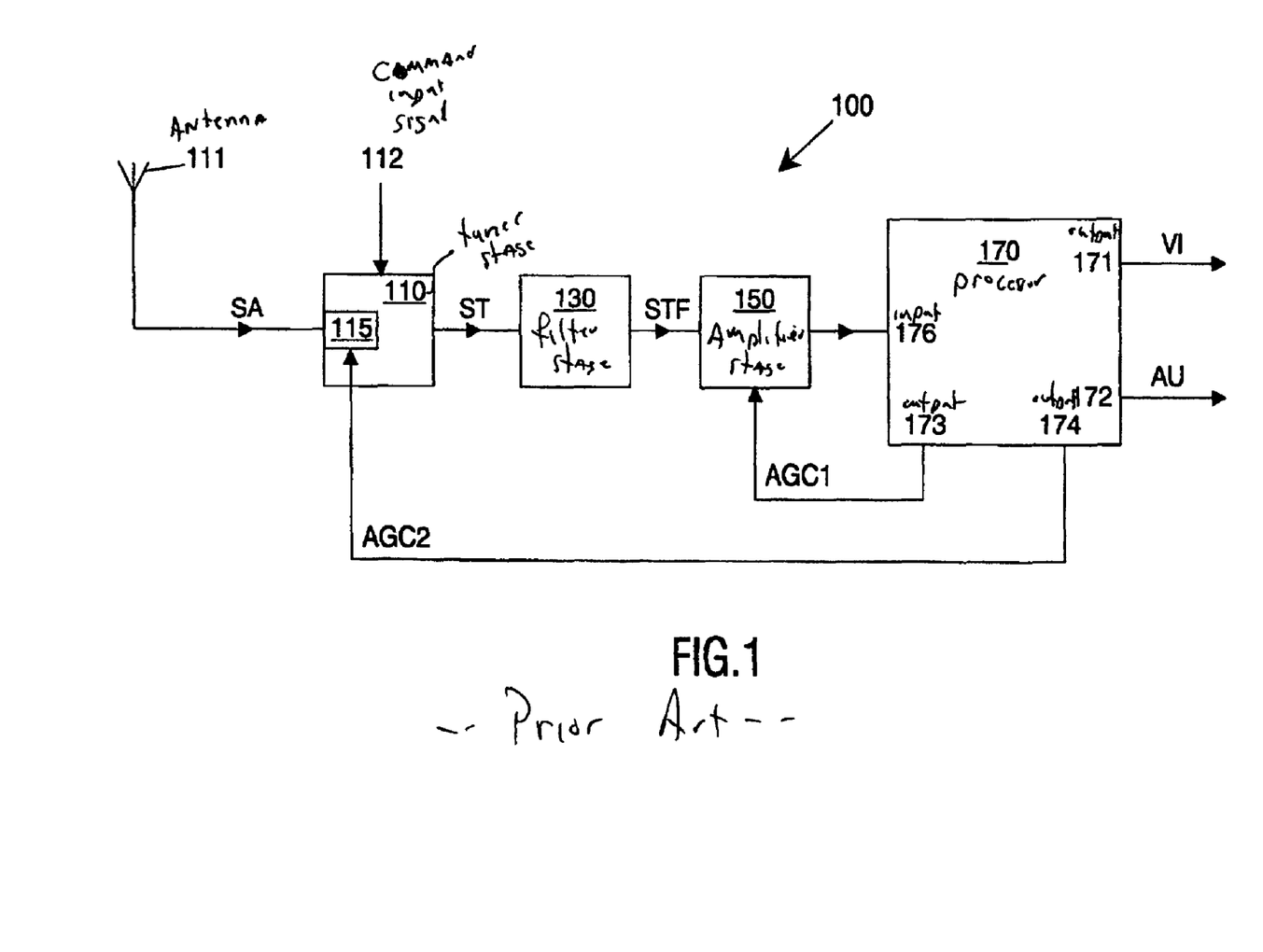
FIG. 1 is a block diagram schematically illustrating a conventional television receiver.

FIG. 1 schematically illustrates the general signal processing in a conventional television receiver 100 for receiving television signals and providing desired video and audio signals corresponding to a selected television channel. Generally, the television receiver 100 comprises a tuner stage 110, a filter stage 130, an amplifier stage 150, and a processor 170.

The tuner stage 110 receives an antenna signal SA from an antenna 111. In principle, the antenna signal SA may contain all frequencies in the (television) electromagnetic spectrum (typically ranging from about 48 MHz to about 865 MHz). On the basis of a command input signal 112, such as issued by a user, the tuner stage 110 generates a tuner output signal ST, which comprises the video and audio signal of one selected television channel, shifted to a predetermined frequency range. The tuner output signal ST is filtered by filter stage 130 to substantially remove all unwanted frequencies outside said predetermined frequency range, resulting in a filtered tuner output signal STF which only comprises the desired frequencies of picture and sound signals of the selected channel. The filtered tuner output signal STF, after suitable amplification by amplifier stage 150, is demodulated in processor 170, which provides, inter alia, a video signal V1 at a first output 171 and an audio signal AU at a second output 172. The processor 170 also provides, at a third output 173, a first automatic gain control signal AGC1 for the amplifier stage 150.

The tuner 110 comprises an RF amplifier 115 for amplifying the antenna signal SA received from the antenna 111. The gain of the RF amplifier 115 is controlled by a second automatic gain control signal AGC2 provided by the processor 170 at a fourth output 174 thereof.

Figure 2A:
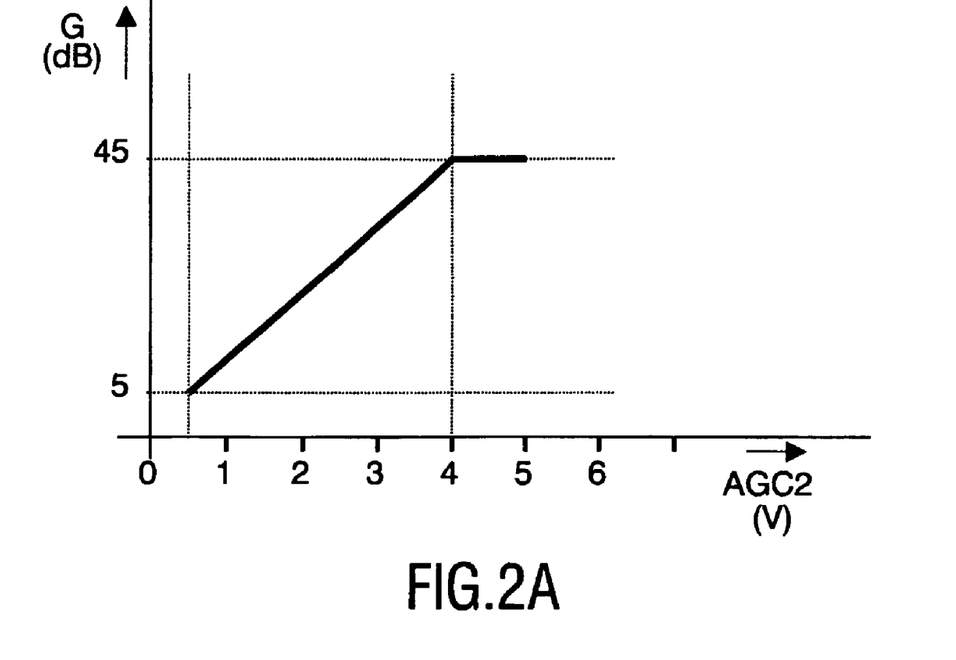
FIG. 2A is a graph illustrating AGC behavior of a tuner.
Figure 2B:
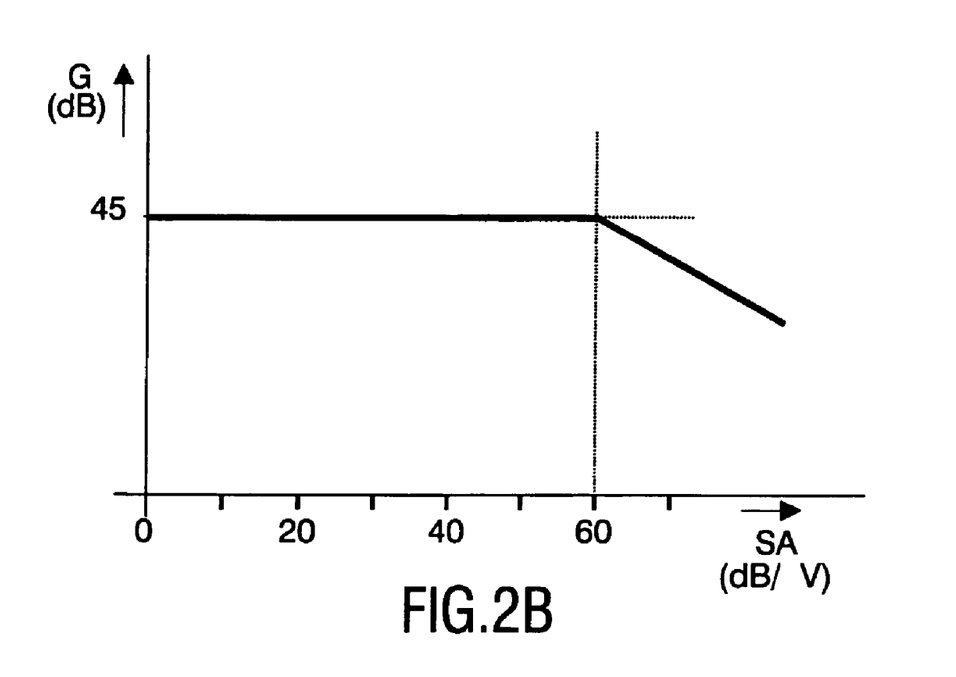
FIG. 2B is a graph illustrating AGC behavior of a processor.

It is noted that, in a conventional television receiver, a tuner stage 110, a filter stage 130, an amplifier stage 150 and a processor 170 are known components, so that a more detailed discussion of their design and operation is omitted here. Only the conventional functioning of the automatic gain signal-generating portion of the processor 170 will be described in somewhat more detail with reference to FIG. 2.

FIG. 2A is a graph illustrating a typical behavior of the tuner stage 110; more particularly, this graph illustrates a typical relationship between the second automatic gain control signal AGC2 (horizontal axis) and the gain G of the tuner stage 110 (vertical axis). The second automatic gain control signal AGC2 is a DC voltage level, which can be set in a range from a minimum value (typically 0.5 V) to a maximum value (typically 5 V). For values above a predetermined first gain control level (typically 4 V), the gain G of the tuner stage 110 is at its maximum, which typically is about 45 dB. For values below this predetermined first gain control level, the gain G of the tuner stage 110 decreases with a decreasing value of the gain control signal AGC2, typically reaching a value of 5 dB at a gain control signal value of 0.5 V.

FIG. 2B is a graph illustrating a typical behavior of the processor 170. More particularly, this graph illustrates a typical relationship between the signal strength of the antenna signal SA (horizontal axis) and the gain G of the tuner stage 110 (vertical axis) as set by the processor 170. As long as the antenna signal SA is below a predetermined level, typically 60 dB/μV, the gain of the tuner stage 110 is kept constant, namely maximum, which typically is about 45 dB. To this end, the processor 170 generates its second automatic gain control signal AGC2 for the wideband RF amplifier 115 at the maximum level of 5 V such that the gain G of the RF amplifier 115 stays at its maximum value. Then, the signal level of the tuner output signal ST is below a maximum level of about 105 dB/μV. In that case, the processor 170 generates its first automatic gain control signal AGC1 for the amplifier stage 150 so as to keep the signal level of the corresponding video signal V1 and audio signal AU at a constant level.

If the antenna signal SA exceeds the predetermined level of typically 60 dB/μV, this is sensed by the processor 170 because the signal level of the tuner output signal ST then exceeds said maximum level of about 105 dB/μV (more specifically, the signal level of the signal received by the processor 170 at its signal input 176 exceeds a predetermined maximum input signal level). In this case, the processor 170 generates its second automatic gain control signal AGC2 for the wideband RF amplifier 115 so as to keep the signal level of the tuner output signal ST substantially constant at said predetermined maximum level of typically about 105 dB/μV, whereas the processor 170 generates its first automatic gain control signal AGC1 for the amplifier stage 150 so as to keep the gain of the amplifier stage 150 at a substantially constant value.

Figure 3:
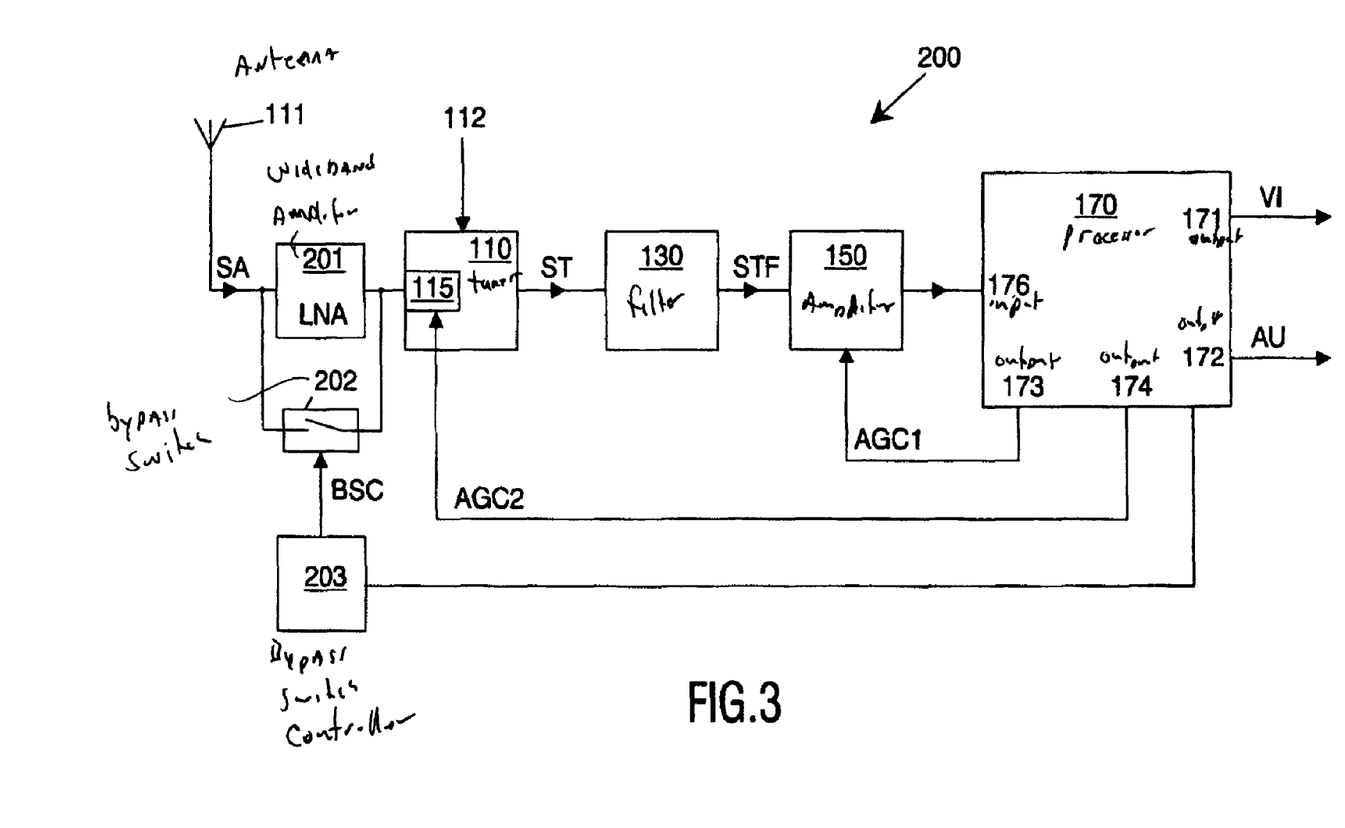
FIG. 3 is a block diagram, comparable to FIG. 1, schematically illustrating a television receiver according to the present invention.

FIG. 3 is a block diagram comparable to FIG. 1, schematically illustrating a television receiver 200 which is provided with an additional wideband amplifier 201, hereinafter also called LNA (Low Noise Amplifier), which typically has a range from 45 to 865 MHz, for pre-amplifying the wideband antenna signal SA. This LNA 201 may be an integral part of the tuner 110, but for clarity's sake the LNA 201 is shown as a separate component having an output connected to a tuner input.

A noise performance parameter "Noise Figure" NF of a circuit block will hereinafter be defined as follows:

$$NF = CN_{IN}/CN_{OUT},$$

wherein $CN_{IN}$ is the carrier-to-noise ratio at the input of the block, and wherein $CN_{OUT}$ is the carrier-to-noise ratio at the output of the block.

An LNA 201 as mentioned above improves the signal-to-noise ratio S/N of the television receiver 200. Standard tuners 110 typically have a noise figure NF in the range between 6 dB and 11 dB. The LNA 201 may have gain of about 12 dB and a noise figure NF typically less than about 2.5 dB, in which case the combination of LNA 201 plus tuner 110 will have a noise figure typically in the range from 3 to 4 dB. The noise-related performance of television receivers is thus improved by including an LNA 201.

A problem of the LNA is that it tends to introduce intermodulation products at frequencies within the passband of the selected channel. These intermodulation products are generated because of cross-modulation between the desired signal (channel to which the tuner 110 is tuned) and the non-desired signals from neighboring channels, and also because of cross-modulation between the non-desired channels. If this happens, indeed, it is very difficult or even impossible to eliminate such intermodulation products in subsequent signal processing, because these intermodulation products are located within the passband of the selected channel. Finally, the produced video signal output will thus be deteriorated by these interfering intermodulation products.

As a consequence, it is necessary to switch off the LNA 201, or to bypass the LNA 201 if the signal at the input of the tuner 110 exceeds a predetermined decision levels. Typically, the LNA 201 is switched OFF when the RMS value of the signal at the input of the tuner 110 exceeds a level of about 60 dB/μV. FIG. 3 shows a bypass switch 202 coupled in parallel to the LNA 201, controlled by a bypass switch control signal BSC from a bypass switch controller 203. It is noted that the controller 203 may be part of the processor 170, but it is shown as a separate unit for the sake of clarity.

One embodiment of the present invention relates to a method for measuring whether the RMS value of the signal at the input of the tuner 110 does or does not exceed said level of about 60 dB/μV. To this end, the present invention takes advantage of the fact that the processor 170 already performs a control action based on the question whether the RMS value of the signal at the input of the tuner 110 does or does not exceed the level of about 60 dB/μV. Therefore, instead of monitoring the RMS value of the antenna signal SA or the signal at the input of the tuner 110, the controller 203 monitors the decision of the processor 170 in this respect.

Figure 4A:
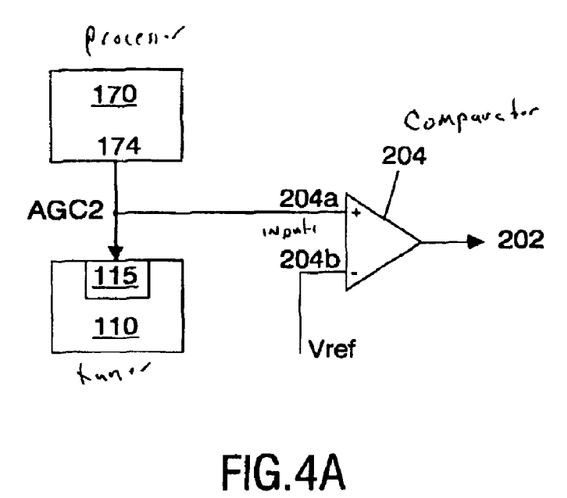
FIGS. 4A and 4B are diagrams schematically illustrating details of possible embodiments of a television receiver according to the present invention.

FIG. 4A illustrates one embodiment of the controller 203 according to the present invention. In this embodiment, the controller 203 comprises a comparator 204 having one input 204a coupled to receive the second automatic control signal AGC2 from the processor 170, and another input 204b coupled to receive a suitably selected reference voltage $V_{ref}$, for instance 4.5 V. As long as the antenna signal SA is below said level of 60 dB/μV, the second automatic control signal AGC2 has the value of about 5 V, clearly higher than the reference voltage. $V_{ref}$, so that the output of the comparator 204 is logically HIGH. As soon as the signal at the input of the tuner 110 exceeds the level of 60 dB/μV, the processor 170 starts AGC action, in which case the second automatic control signal AGC2 has a value lower than 4 V, clearly lower than the reference voltage $V_{ref}$, so that the output of the comparator 204 is logically LOW. The output signal of the comparator 204 can be used for switching the bypass switch 202, either directly or after some further processing. It is noted that other methods for sensing the voltage drop from 5 V to 4 V are also possible.

Figure 4B:
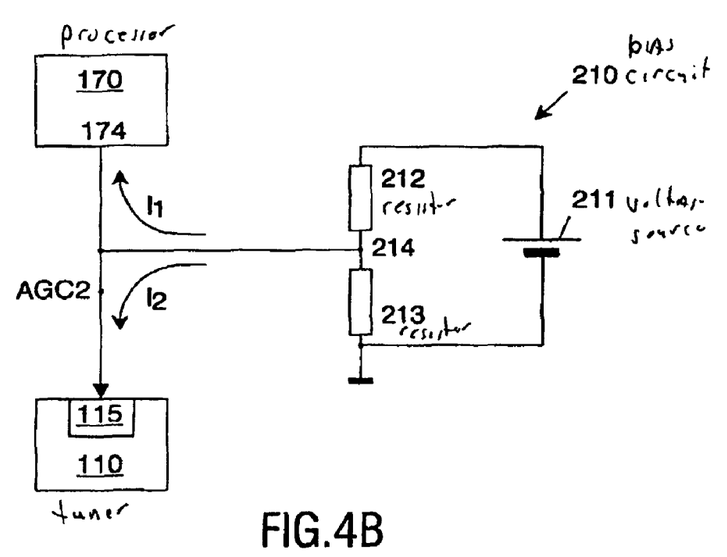

FIG. 4B illustrates another embodiment for monitoring the AGC control action of the processor 170 in accordance with the present invention. In this case, a bias circuit 210 is provided, comprising a parallel combination of a voltage source 211 and two resistors 212 and 213 connected in series. The node 214 between the two resistors 212 and 213 can be considered as an output of the bias circuit 210, connected to the fourth output 174 of the processor 170.

As long as the signal at the input of the tuner 110 is below the level of 60 dB/μV, the current I1 drawn by the processor 170 at its fourth output 174 from the node 214 is substantially zero. The current I2 drawn from the node 214 by the tuner stage 110 is negligible. The bias circuit 210 is designed in such a way that, when the current drawn from node 214 is zero, the voltage at node 214 is about 5V.

As soon as the signal at the input of the tuner 110 exceeds the level of 60 dB/μV, the signal level of the signal received by the processor 170 at its signal input 176 exceeds the predetermined maximum input signal level, and the processor 170 starts AGC action, in which case the current I1 drawn from the node 214 by the processor 170 at its fourth output 174 rises. In an example of an embodiment, this current I1 may be proportional to the difference between the signal level of the signal received by the processor 170 at its signal input 176, on the one hand, and the predetermined maximum input signal level, on the other hand, for instance 500 μA/dB. As result of this current I1, the voltage at node 214 will drop. The bias circuit 210 is designed in such a way that the voltage drop at node 214 is proportional to the current I1, for instance 4 V/mA. As mentioned earlier, as soon as the processor 170 starts AGC action, the second automatic control signal AGC2 has a value lower than 4 V, i.e. a voltage drop of at least 1 V occurs, corresponding to a current I1 of at least 250 μA. The processor 170 is designed to be capable of sensing this current I1, and to generate a control signal for switching the bypass switch 202, either directly or after some further processing.

In the prior art, the quality of the signal at the input of the tuner 110 is monitored constantly, so the LNA 201 may be switched ON and OFF repeatedly even when the user is constantly watching one television program, which results in noticeable display effects and is therefore annoying to the user.

In order to prevent this, in a preferred embodiment according to the present invention, the LNA 201 can only be switched ON at the moment when the user activates the television receiver or switches over to a new channel. With the LNA 201 in the On state, the quality of the signal at the input of the tuner 110 is monitored constantly, and a decision may be made to switch OFF the LNA 201 (i.e. to close the bypass switch 202) at any moment. With the LNA 201 in the OFF state, the bypass switch 202 is maintained in the closed state during the remainder of the selected television program, until the user switches over to a new channel.

It is noted that, with the LNA 201 in the ON state, the decision to switch OFF the LNA 201 is based on the signal level at the output of LNA 201. In case the LNA 201 has a gain of about 12 dB, the decision level of 60 dB/μV of the signal at the input of the tuner 110 corresponds to a level of 48 dB/μV of the antenna signal SA.

In the prior art, the decision whether or not to activate the LNA is based entirely on the quality of the signal in the selected channel. After all, the processor 170 generates the second gain control signal AGC2 for the tuner stage 110 on the basis of the signal received from the amplifier stage 150, which necessarily only comprises signals in the passband. However, the main reason for bypassing the LNA is to reduce undesired effects from intermodulation products, but the processor 170 does not generate its second gain control signal AGC2 for the tuner 110 on the basis of the actual presence or absence of such intermodulation products. Therefore, when the decision to switch the LNA ON or OFF is based entirely on the AGC control mode, the actual presence or absence of such intermodulation products is not taken into account at all.

In order to overcome this disadvantage, the present invention proposes to provide a measuring signal which is indicative of the actual presence or absence of intermodulation products, and to base, at least partly, the decision to switch the LNA ON or OFF on this measuring signal indicating intermodulation products, which signal will hereinafter be indicated as $S_{IP}$.

Intermodulation products may be considered as noise, therefore one specific implementation of the measuring signal $S_{IP}$ indicating intermodulation products can be obtained by measuring a signal-to-noise ratio S/N. S/N can be defined as the ratio of the peak-to-peak value of the video signal (VSpp) to the RMS value of the noise signal ($NS_{RMS}$), i.e. $S/N=VSpp/NS_{RMS}$. Because of the automatic gain control action of the processor 170, the video signal V1 at the first output 171 has a substantially constant peak-to-peak value for a large variation of the signal level of the RF antenna signal SA. Generally, the video output level remains substantially constant when the signal level of the RF antenna signal SA varies from 20 dB/μV to 100 dB/μV. Therefore, it is desirable to obtain a signal which substantially only indicates the RMS value of the noise signal ($NS_{RMS}$). It is not necessary to have a signal, which indicates the peak-to-peak value of the video signal (VSpp), as this would be a substantially constant signal anyway.

Basically, it is very difficult or even impossible to separate the video signal and the noise once they are present in a signal. However, in a preferred embodiment, advantageous use is made of the fact that some lines of a CVBS video signal, such as the lines 17 and 18, are blank during vertical flyback, which means that the video signal should be at a constant DC level during the horizontal scanning period of such lines. In other formats, other line numbers may be blank.

The noise generated from electronic circuits like amplifiers is normally distributed in a uniform manner over the video signal. Therefore, any AC signal during the horizontal scanning period of such blank lines is directly related to the RMS value of the noise signal in the CVBS video signal, and a measurement of this AC signal provides a signal which substantially indicates the RMS value of the noise signal ($NS_{RMS}$).

Normally, the CVBS signals of different channels are not synchronized, so the blank period of lines 17 and 18 usually does not coincide with the blank period of lines in the CVBS signals of neighboring, i.e. disturbing channels. Therefore, it is to be expected that, if intermodulation products are generated by undesired channels, the peak amplitudes of such disturbing intermodulation products are present during the blank period of lines 17 and 18 of the selected signal, at least during some time, in regular intervals.

In a practical embodiment, when measuring the noise signal ($NS_{RMS}$), the measured noise is the combination of widely distributed noise and the noise created by intermodulation products. It may be assumed that there are no intermodulation products, or that any such intermodulation products may be neglected if the LNA is OFF.

As mentioned above, the present invention proposes to make the decision to switch the LNA ON or OFF on the basis of the measuring signal $S_{IP}$ which indicates intermodulation products. In one practical embodiment, it is possible to base the decision on an absolute measurement, made by comparing the noise level in the signal with a predetermined decision level. This predetermined decision level may correspond to a signal/noise ratio of 43 dB, which is a noise ratio acceptable for consumers. If the signal/noise ratio is better than 43 dB, the signal conditions may be considered to be good, and there is no need for the LNA.

Thus, on selecting a channel, or on switching ON the receiver, the LNA 201 is initially switched OFF. If the measuring signal $S_{IP}$ indicates a signal/noise ratio better than 43 dB, the bypass switch controller 203 decides to keep the LNA 201 switched OFF.

In a further elaboration of the invention, the influence of the LNA 201 is explicitly taken into account. In order to take into account the influence of the LNA 201, the signal-to-noise ratio is measured at least two times: one time with the LNA 201 switched ON, and one time with the LNA 201 switched OFF, and the two measurement results are compared will each other.

This procedure may always be executed in order to avoid the need to predefine the predetermined decision level. It is also possible to perform this comparison procedure only as a second phase procedure after it has been determined that the measuring result obtained with the LNA 201 switched OFF, indicated as $S_{IP}$(LNA=OFF), indicates a signal/noise ratio worse than 43 dB.

If the measured result $S_{IP}$(LNA=OFF) indicates a signal/noise ratio worse than 43 dB, which is due to noise only, it may be desirable to switch ON the LNA. In this case, the measured result $S_{IP}$(LNA=OFF) is stored in a memory to serve as a reference value. Next, the LNA 201 is switched ON, and the signal-to-noise ratio is measured with the LNA 201 switched ON, yielding a measured result indicated as $S_{IP}$(LNA=ON). This result is compared with the previous measured result $S_{IP}$(LNA=OFF) stored in the memory, and it is decided to switch the LNA 201 to the state which provides the best quality. It will hereinafter be assumed that a higher value of $S_{IP}$ indicates more intermodulation products. Thus, if $S_{IP}$(LNA=ON) <$S_{IP}$(LNA=OFF), it is decided to keep the LNA switched ON, whereas, if $S_{IP}$(LNA=ON) >$S_{IP}$(LNA=OFF), it is decided to keep the LNA switched OFF.

Preferably, if $S_{IP}$(LNA=ON)=$S_{IP}$(LNA=OFF), it is decided to keep the LNA switched ON.

Preferably, $S_{IP}$(LNA=OFF) is measured first, and then $S_{IP}$(LNA=ON) is measured, as described above, although it is possible to perform said measurements in the opposite order.

As mentioned above, the decision to keep the LNA in the ON or OFF state is basically only made at a moment when the television receiver is switched on, or at a moment when the user switches over to another channel. Under certain circumstances, however, the measurement may not reliably reflect the amount of disturbance caused by intermodulation products.

For instance, it is to be expected that, at any time, the disturbance caused by intermodulation products is proportional to the signal intensity at that time of the disturbing signal of the neighboring channel. However, this signal intensity is not constant. In the case of a negative modulation format, the modulation depth of the carrier wave is maximum during a white portion of a picture frame, and minimum during the synchronization period. Thus, the measuring signal $S_{IP}$ indicating intermodulation products as measured at a certain time depends on the picture frame contents of the neighboring channel at that time, i.e. white portion, black portion, synchronization period; this may amount to a difference of 15 dB. It may thus happen that, when the user switches over to another channel and the measuring signal $S_{IP}$ indicating intermodulation products is measured, the disturbing signal of the neighboring channel just corresponds to a white portion, i.e. the signal intensity at that time is low and almost no noise from intermodulation products is detected, causing the bypass switch controller 203 to decide to keep the LNA switched ON, whereas other parts of the disturbing signal of the neighboring channel, such as black portions or synchronization pulses, do cause annoying intermodulation products and would cause the bypass switch controller 203 to decide to keep the LNA switched OFF if such a situation had been detected.

In practice, the vertical periods of the CVBS video signals in different channels do not have exactly the same length. As a consequence, in the course of time, the measuring period (lines 17 and 18) of the selected signal will shift with respect to the neighboring channels, and will correspond to other signal portions of the neighboring channels.

In a further elaboration of the present invention, this effect is used as follows. Initially, i.e. on start-up of the television receiver or on switching over to a different channel, the LNA is switched OFF and the value $S_{IP}$(LNA=OFF) of the measuring signal $S_{IP}$ indicating intermodulation products is measured. The measuring result is stored. Then, the LNA is switched ON, and the value $S_{IP}$(LNA=ON) of the measuring signal SIP indicating intermodulation products is measured. This value is compared with the stored measuring result $S_{IP}$(LNA=OFF), and a decision is taken to switch the LNA ON or OFF on the basis of the outcome of this comparison.

If it is decided to switch ON the LNA, the value $S_{IP}$(LNA=ON) of the measuring signal $S_{IP}$ indicating intermodulation products is measured regularly (for instance: once per predetermined period, such as once per second). After each measurement, the latest value $S_{IP}$(LNA=ON) is compared with the initially measured value $S_{IP}$(LNA=OFF). As long as the condition $S_{IP}$(LNA=ON)$\leq S_{IP}$(LNA=OFF) applies, it is decided to keep the LNA switched ON. As soon as the condition $S_{IP}$(LNA=ON)>$S_{IP}$(LNA=OFF) occurs, it is decided to switch OFF the LNA, and to keep the LNA switched OFF, irrespective of changes in the value $S_{IP}$(LNA=ON), so that in fact the process of measuring the value $S_{IP}$(LNA=ON) and comparing with the value $S_{IP}$(LNA=OFF) may be stopped (which avoids the necessity of having to switch the LNA ON and OFF regularly).

In practice, the measuring signal $S_{IP}$ indicating intermodulation products can only take values within a predetermined range of values. For instance, if the value of $S_{IP}$ is stored in a memory register having N bits, $S_{IP}$ can only take values between 0 (indicated as $S_{MIN}$) and $2^{N-1}$ (indicated as $S_{MAX}$). If the noise caused by the intermodulation products is very heavy, the initially measured value $S_{IP}$(LNA=OFF) may already have an extreme value of said range, in this case $S_{MAX}$ (or $S_{MIN}$, in cases where high noise corresponds to low values of $S_{IP}$). Although it should be expected that the noise caused by the intermodulation products is even worse when the LNA is switched ON, this cannot be expressed by the measuring signal $S_{IP}$ indicating intermodulation products because its value cannot exceed $S_{MAX}$ (or below $S_{MIN}$, respectively). Then, the bypass switch controller 203 cannot decide adequately, because the two measured values $S_{IP}$(LNA=OFF) and $S_{IP}$(LNA=ON) do not correctly reflect the relative intensities of the intermodulation products.

In a further elaboration of the present invention, this problem is avoided as follows. Initially, i.e. on start-up of the television receiver or on switching over to a different channel, the LNA is switched OFF and the value $S_{IP}$(LNA=OFF) of the measuring signal $S_{IP}$ indicating intermodulation products is measured. Also, the value $S_{IP}$(LNA=ON) of the measuring signal $S_{IP}$ indicating intermodulation products is measured, and compared with the value $S_{IP}$ (LNA=OFF). As before, if $S_{IP}$(LNA=ON)<$S_{IP}$(LNA=OFF) then it is decided to keep the LNA switched ON, whereas if $S_{IP}$(LNA=ON)>$S_{IP}$(LNA=OFF) it is decided to keep the LNA switched OFF.

In case $S_{IP}$(LNA=ON)=$S_{IP}$(LNA=OFF), a check is made as to whether $S_{IP}$(LNA=OFF) has the extreme value $S_{MAX}$. If it appears that $S_{IP}$(LNA=OFF) is lower than the extreme value $S_{MAX}$, it is decided to keep the LNA switched ON, as before. If it appears that $S_{IP}$(LNA=OFF) is equal to the extreme value $S_{MAX}$, it is decided to switch OFF the LNA and to keep the LNA in the OFF state as long as the present channel remains the selected channel. This method of switching provides an improvement of the performance by about 4 to 8 dB, especially in the UHF band. In the UHF band, the noise figure NF for the tuner stage 110 is about 8 to 12 dB. By using an LNA with a noise figure NF of about 3 dB, the overall noise figure will be about 4 dB, i.e. an improvement of about 4 to 8 dB.

It should be clear to a person skilled in the art that the present invention is not limited to the embodiments discussed above, but that several variations and modifications are possible within the protective scope of the invention as defined in the appending claims.

For instance, any other signal, which is capable of representing a noise content, can be used for indicating intermodulation products.

Furthermore, it is noted that the decision-making process as described may be implemented in hardware or software, or firmware, as desired.

In the claims, any reference signs placed between parentheses shall not be construed as limiting the claim. Use of the verb "comprise" and its conjugations does not exclude the presence of elements or steps other than those stated in a claim. Use of the article "a" or "an" preceding an element or step does not exclude the presence of a plurality of such elements or steps. The invention can be implemented by means of hardware comprising several distinct elements, and by means of a suitably programmed computer. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A method for automatically setting an operative state of a wideband amplifier in a multi-channel television receiver, the method comprising the steps of:
   measuring at least one signal quality parameter; and
   deciding to switch the amplifier either to its ON state (active state) or to its OFF state (inactive state) on the basis of the measured parameter,
   wherein the step of deciding to switch the amplifier to its ON state (active state) is exclusively taken during at least one time interval when the receiver is switched to a channel, or during activation of the multi-channel television receiver, or during an installation process when all channels are scanned
   wherein the step of deciding to switch the amplifier comprises the steps of:
   a) switching the amplifier to its OFF state (inactive state);
   b) measuring a value of $S_{IP}$(LNA=OFF) said at least one signal quality parameter while the amplifier is maintained in its OFF state;
   c) switching the amplifier to its ON state (active state);
   d) measuring a value of $S_{IP}$(LNA=ON) said at least one signal quality parameter while the amplifier is maintained in its ON state;
   e) comparing the two measured values ($S_{IP}$(LNA=OFF); $S_{IP}$(LNA=ON));
   f) the difference between the two measured values ($S_{IP}$(LNA=OFF); $S_{IP}$(LNA=ON)) indicates more intermodulation products in the case when the amplifier' is in its OFF state as compared to the case when the amplifier is in its ON state, deciding to switch the amplifier to its ON state;
   g) if the difference between the two measured values ($S_{IP}$(LNA=OFF); $S_{IP}$(LNA=ON)) indicates more intermodulation products in the case when the amplifier is in its ON state as compared to the case when the amplifier is in its OFF state, deciding to switch the amplifier to its OFF state.

2. A method according to claim 1, wherein, if it has been decided to switch the amplifier to its ON state (active state) on the basis of the measuring result, signal quality monitoring procedures are performed repeatedly, each procedure comprising the steps of:
   remeasuring said signal quality parameter;
   deciding, on the basis of the remeasured parameter, to either maintain the amplifier in its ON state (active state) or to switch the amplifier to its OFF state (inactive state).

3. A method according to claim 1, wherein the step of measuring at least one signal quality parameter comprises the step of measuring intermodulation products or a noise-related signal or determining whether an automatic gain control system of the receiver is active or inactive.

4. A method according to claim 1, wherein steps (a) and (b) are taken before steps (c) and (d).

5. A method according to claim 1, comprising the step of:
h3) if the two measured values ($S_{IP}$(LNA=OFF); $S_{IP}$(LNA=ON)) are mutually equal, deciding to switch the amplifier to its ON state.

6. A method according to claim 1, comprising the step of:
h3) if the two measured values ($S_{IP}$(LNA=OFF); $S_{IP}$(LNA=ON)), are mutually equal ($S_{IP}$(LNA=OFF) =$S_{IP}$(LNA=ON)):
h3i) checking whether the value $S_{IP}$(LNA=OFF) of the signal quality parameter in the case of the amplifier being switched OFF has an extreme value ($S_{MAX}$);
h3ii) if the value $S_{IP}$(LNA=OFF) of the signal quality parameter in the case of the amplifier being switched OFF is unequal to said extreme value, deciding to switch the amplifier to its ON state;
h3iii) if the value $S_{IP}$(LNA=OFF) of the signal quality parameter in the case of the amplifier being switched OFF is equal to said extreme value, deciding to switch the amplifier to its OFF state.

7. A method according to claim 1, wherein the step of measuring at least one signal quality parameter comprises the step of measuring signal conditions of all available channels and the steps of measuring and deciding to switch are taken exclusively during an initializing procedure of the receiver.

8. A method according to claim 7, wherein the at least one signal quality parameter comprises a signal-to-noise ratio and a signal strength of each of the available channels.

9. A multi-channel television receiver comprising:
an input for receiving a wideband signal potentially comprising multiple channels;
a tuner stage;
a wideband amplifier connected between said input and said tuner;
a controllable switch bridging said amplifier;
a switch controller designed to generate a switch control signal (BSC);
wherein the switch controller is designed to measure at least one signal quality parameter and to generate its switch control signal (BSC) on the basis of the measured parameter;
and wherein the switch controller is designed to switch the switch from its closed state (amplifier inactive) to its open state (amplifier active) exclusively during at least one time interval when a channel is selected
wherein the controller is designed to:
a) switch the amplifier to its OFF state (inactive state);
b) measure a value of $S_{IP}$(LNA=OFF) said at least one signal quality parameter while the amplifier is maintained in its OFF state;
c) switch the amplifier-to its ON state (active state);
d) measure a value of $S_{IP}$(LNA=ON) said at least one signal quality parameter while the amplifier is maintained in its ON state;
e) compare the two measured values ($S_{IP}$(LNA=OFF); $S_{IP}$(LNA=ON));
f) if the difference between the two measured values ($S_{IP}$(LNA=OFF); $S_{IP}$(LNA=ON)) indicates more intermodulation products in the case when the amplifier's in its OFF state as compared to the case when the amplifier is in its ON state, deciding to switch the amplifier to its ON state;
g) if the difference between the two measured values ($S_{IP}$(LNA=OFF); $S_{Ip}$(LNA=ON)) indicates more intermodulation products in the case when the amplifier is in its ON state as compared to the case when the amplifier is in its OFF state, deciding to switch the amplifier to its OFF state.

* * * * *